United States Patent [19]
Groussin

[11] Patent Number: 5,309,470
[45] Date of Patent: May 3, 1994

[54] ELECTRICAL DISTRIBUTION SYSTEM FOR SEMICONDUCTOR LASER INTEGRATED CIRCUIT

[75] Inventor: Bernard Groussin, Les Ulis, France

[73] Assignee: Thomson Hybrides, Puteaux, France

[21] Appl. No.: 988,758

[22] Filed: Dec. 10, 1992

[30] Foreign Application Priority Data

Dec. 10, 1991 [FR] France .................. 91 15269

[51] Int. Cl.$^5$ .................................. H01S 3/19
[52] U.S. Cl. .................... 372/50; 3721/48; 3721/99; 3721/97; 3721/23
[58] Field of Search ............ 372/50, 48, 99, 97, 372/23

[56] References Cited

U.S. PATENT DOCUMENTS

| 4,881,237 | 11/1989 | Donnelly | 372/50 |
| 5,001,719 | 3/1991 | Trussell | 372/50 |
| 5,012,427 | 4/1991 | Mesqurde et al. | 372/50 |
| 5,159,603 | 11/1992 | Kim | 372/45 |

FOREIGN PATENT DOCUMENTS 369856 5/1990 European Pat. Off. .

OTHER PUBLICATIONS

Goodhue, et al., Applied Physics Letters, vol. 59, No. 6, Aug. 5, 1991, pp. 632-634. "Monolithic two-dimensional surface-emitting strained-layer InGaAs/AlGaAs and AlInGaAs/AlGaAs diode laser arrays with over 50% differential quantum efficiencies".

Primary Examiner—Georgia Y. Epps
Attorney, Agent, or Firm—Oblon, Spivak, McClelland, Maier & Neustadt

[57] ABSTRACT

The invention applies to a laser integrated circuit comprising at least one row of lasers (30) lying between two reflector strips (28). The lasers (18) are electrically connected in parallel. The light emission along the strip will be more uniform if the electrical current is distributed by two "combs" whose "teeth" are parallel to the laser ribbons (18) and interleaved with them. The terminal metallized area (44) for the first comb is deposited at the bottom of a recess (18) and the terminal metallized areas (45) for the second comb are on the surface of the row. Such a device finds particular application to the power supply for laser integrated circuits.

9 Claims, 2 Drawing Sheets

ELECTRICAL DISTRIBUTION SYSTEM FOR SEMICONDUCTOR LASER INTEGRATED CIRCUIT

BACKGROUND OF THE INVENTION

1. Field of the Invention

This invention applies to semiconductor laser integrated circuits in which rows of lasers alternate with reflector strips, this assembly producing laser beams perpendicular to the general plane of the integrated circuit. More precisely, the invention is a system to distribute electric power to the lasers in a row.

The invention is also a method of producing the system to distribute electrical power to a laser integrated circuit.

2. Discussion of the Background

Semiconductor laser integrated circuits are known to the prior art, for example in French patent No. 88 14799, dated Nov. 15, 1988, the appended FIG. 1 being a three-quarter perspective view, taken from the above-mentioned patent and using the same identification numbers.

A laser integrated circuit includes a substrate 27 in category III-V material: to simplify the explanation, it will be assumed that the substrate is in semi-insulating GaAs. This substrate 27 is machined to produce reflectors 28 in the form of parallel strips, trapezoidal in cross-section with the sides inclined at 45° or semi-circular in cross-section. At least flanks 29 of the strips are metallized to act both as 45° -inclined or semi-cylindrical mirrors and electrical conductors.

Semiconductor laser rows 30 are placed between these reflecting strips. Each row comprises several epitaxial layers of semiconductor material, jointly indicated by reference 16. A series of parallel grooves 17, perpendicular to the center line of each row 30, is then machined in these layers by ion etching. Each pair of grooves 17 delimits an emitter ribbon 18 for an individual laser.

Of the series of epitaxial layers 16, at least the first deposited layer 40 is doped to be conductive and overlaps the free surface 31 of the semi-insulating substrate 27 and the flanks 29 of reflector strips 28.

A metallized film 32 covers the entire top free face of each row of lasers 30 while a metallized film 33 covers the entire top face of each reflector strip 28: these two metallized films 32 and 33, combined with the epitaxial conductive layer 40, distribute electric current to the individual lasers.

When the integrated circuit is switched on, each individual laser emits, from its ribbon 18, a coherent light beam 35 via one cut face and a beam 36 via the other cut face. These two beams are reflected, virtually perpendicular to the general plane of the integrated circuit, by the metallized flanks 29 on reflector strips 28. The complete integrated circuit therefore emits a number of parallel beams 35 and 36, perpendicular to the general plane of the substrate.

FIG. 2 is a cross-section of one region of the integrated circuit shown in FIG. 1. It is intended only to illustrate the distribution of electricity to one row of lasers and only shows the outline of one row 30 and two reflector strips 28 since details of the material layers do not affect the electrical distribution problem.

Electricity is fed vertically to a laser emitter ribbon 18, the current flowing from metal film 32 through the epitaxial layers 16 and returning to metal film 33 via the conductive layer 40 on the free face 31 of the substrate and the surface of mirrors 29. The path followed by the current can be reversed, depending on the polarity applied.

However, if we consider the distribution of the current along a row of lasers 30, it can be seen that metal films 32 are parallel to the longitudinal center line of rows 30; in other words they are perpendicular to the center lines of emitter ribbons 18. Although, in theory, the current is distributed to all lasers in parrallel and the conditions applied to each laser are, therefore, identical, practice shows that lasers further from the power supply terminal emit less light because they receive less electrical power. Regardless of the source impedance, the metallized film 32 is so fine that it offers high resistance and the scale of integration in microelectronics makes it impossible to reduce this resistance by increasing the width or thickness of metallized film 32. Consequently, the 10 to 30 lasers in a row do not all receive the same power supply.

SUMMARY OF THE INVENTION

The invention aims to improve the distribution of electricity to the lasers in a row on a laser integrated circuit of the type described in the patent mentioned earlier. According to the invention, the electric current is distributed by a metallized strip in the form of a comb, the "teeth" of the comb lying perpendicular to the longitudinal axis of a row of lasers and, therefore, parallel to the emitter ribbons. The current returns via a second metallized "comb" orientated in a similar way to the first. To ensure the current flows vertically through each individual laser, one of the two metallized "combs" is submerged: its teeth terminate in recesses produced in the epitaxial layers in the row.

In more precise terms, the invention is a system to distribute electricity to a semiconductor laser integrated circuit, including at least one row of lasers between two reflector strips, perpendicular to the center lines of the laser emitter ribbons in the row, in which the electricity is fed to the layers by two metallized strips, in the forms of combs, positioned on either side of the row and deposited on the reflector strips, the teeth of at least the first "comb" being interleaved with the laser emitter ribbons and each terminating in a metallized strip parallel to the center line of the said emitter ribbons.

BRIEF DESCRIPTION OF THE DRAWINGS

The invention will be better understood and other advantages will become clear upon reading the following description, referring to the appended figures of which.

DETAILED DESCRIPTION OF THE INVENTION

Figure 1:
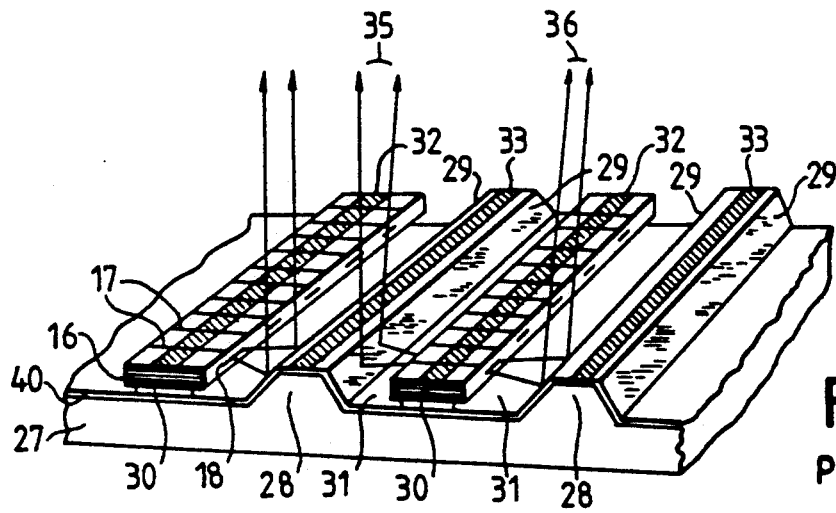
FIG. 1 is a three-quarter perspective view of a laser integrated circuit, known to the prior art, of the type to which this invention applies.
Figure 2:
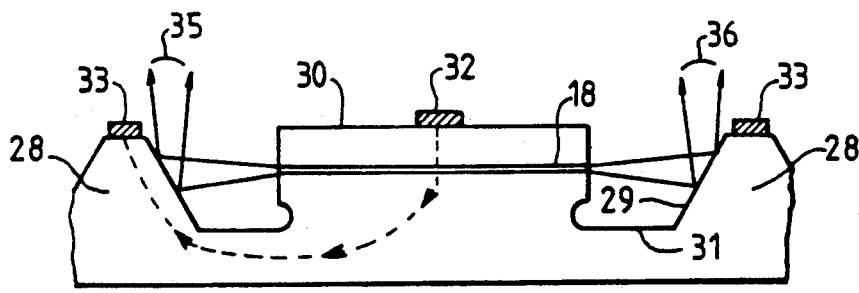
FIG. 2 is a cross-section of an electricity distribution system, as known to the prior art, in a laser integrated circuit.

The invention applies to a laser integrated circuit as described previously and as illustrated in FIGS. 1 and 2. However, the metallization is modified to improve the distribution of electric current to the lasers in a given row and this requires the production of recesses in the epitaxial layers, between the emitter ribbons.

Figure 3:
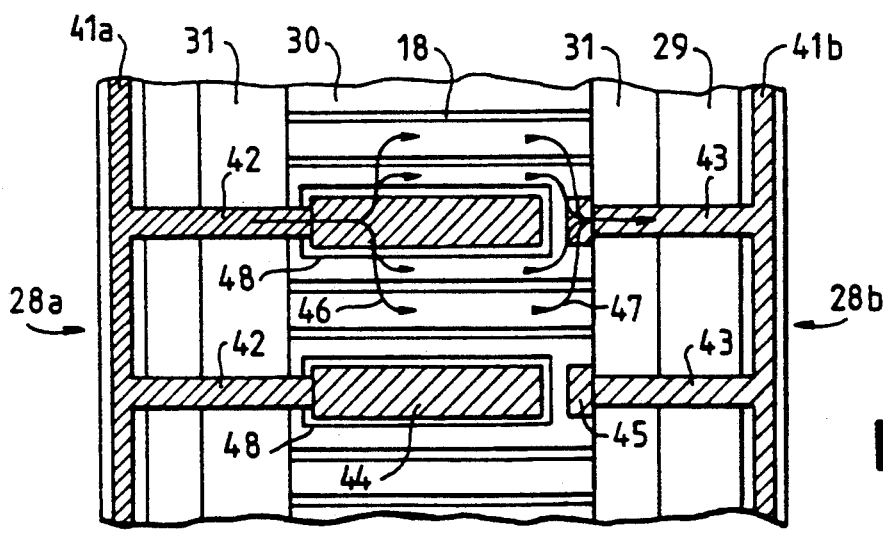
FIG. 3 is a plan view of a system according to the invention to distribute electricity to the lasers in a row in a laser integrated circuit.

FIG. 3 shows a plan view of part of the a system which distributes current to a row of lasers. To facilitate comparison, this figure is at the same scale, and at the same position, as FIG. 2. In addition, the identification numbers are the same as those known to the prior art since they indicate the same objects.

This distribution system uses a first reflector strip 28a as a current distribution bus and a second reflector strip 28b as a current collector bus. The two strips and, therefore, the two buses are parallel to the longitudinal center line or row 30 which they encompass. Both strips, if there is only a single row of lasers, of the two end strips if the integrated circuit carries several laser rows, include conductive buses 41 which, unlike the metallized film 33 in the prior art, are capable of carrying heavy currents without high resistance.

From the first bus 41a, there is a first series of conductive spurs, or "comb teeth" 42 which are placed on the reflector faces 29 and the free surfaces 31, perpendicular to the longitudinal center line of a laser row 30 and, therefore, parallel to emitter ribbons 18. The conductive teeth 42 of the distribution comb lead into the individual lasers and are distributed amongst the various lasers in a given row such that the electrical current is itself uniformly distributed amongst all the lasers in the row.

From a second bus 41b, placed on a strip 28b, a second series of conductive "teeth" 43 form the current collector "comb". The two combs (feed and collector respectively) face the same row of lasers, on either side of it, and the two sets of comb teeth 42 and 43 are virtually aligned. In a given row of lasers 30, a tooth 42 of the distribution comb terminates in a metallized area 44 and a tooth 43 of the collector comb terminates in a metallized area 45. The electric current therefore follows a series of paths from the first comb to the second comb, these paths being parallel to laser ribbons 18 as shown by two groups of arrows 46 and 47 on FIG. 3.

Figure 4:
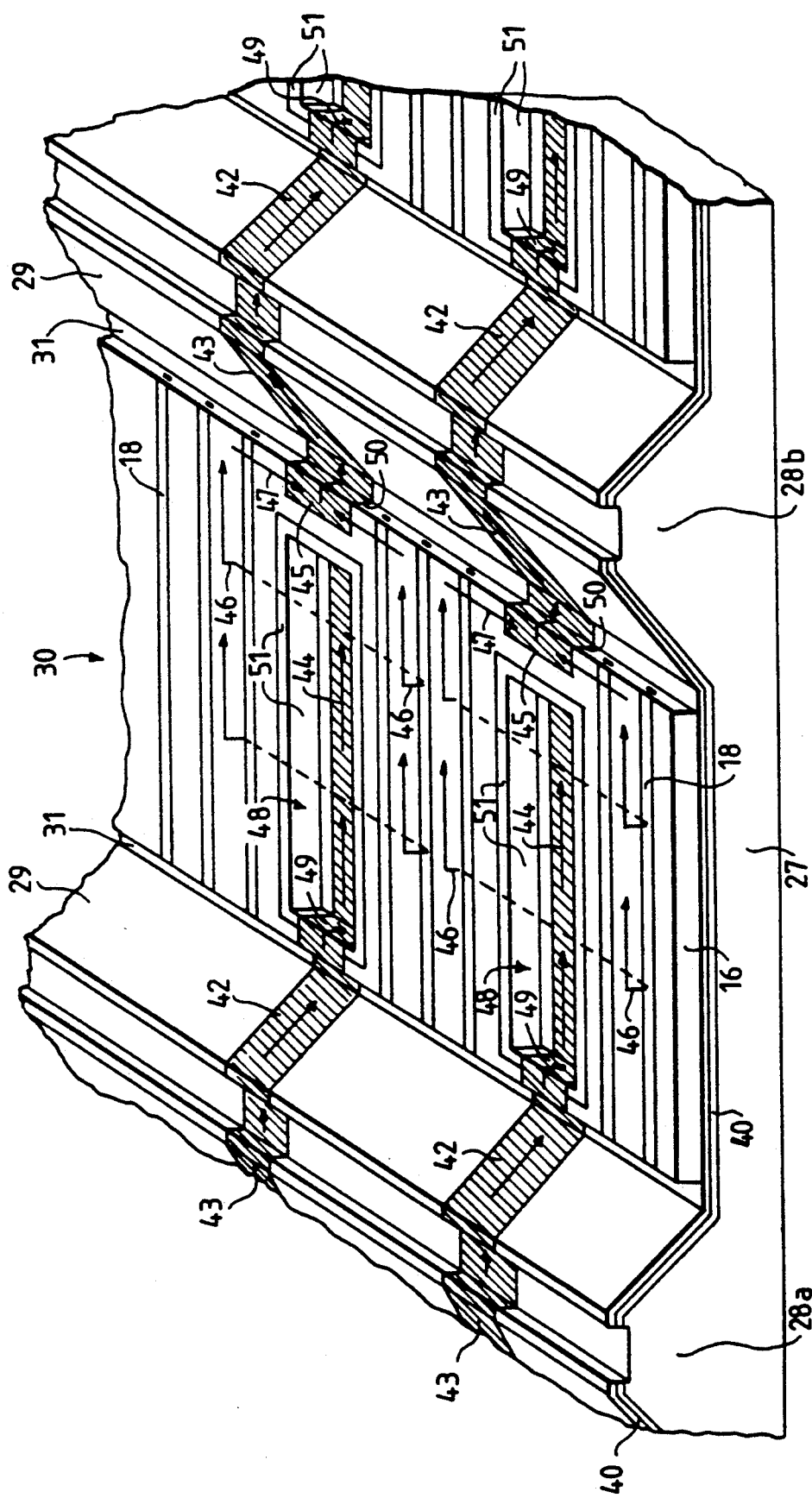
FIG. 4 is a three-quarter perspective view of part of a laser integrated circuit modified to be compatible with the electrical distribution system according to the invention.

The path the current follows through semiconductor layer 16 in row 30 is indicated on FIG. 4, which is a perspective view of part of the integrated circuit according to the invention.

Figure 5:
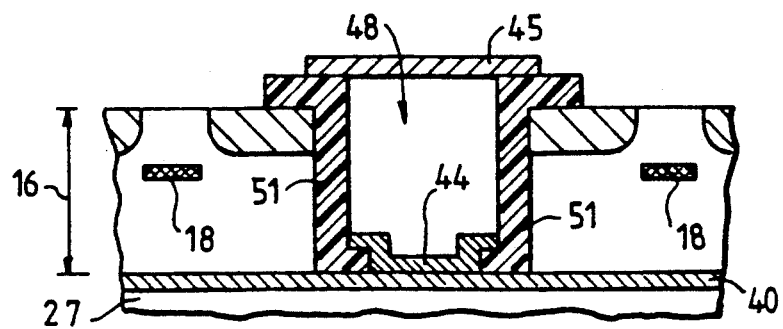
FIG. 5 is a cross-section on an electrical distribution recess according to the invention.

For a laser to operate, and emit a light beam, the current must pass vertically through the various semiconductor layers it contains. Because metallized areas 42 and 43 and 45, which carry the current, are on the surface of the integrated circuit body, each metallized area 44 at the end of a comb tooth 42 is deposited at the bottom of a recess 48 etched through layers 16 down to the conductive doped layer 40. FIG. 5 is a cross-section on a recess 48. On a given row of lasers 30, several recesses are etched parallel to lasers 18 and positioned such that a recess 48, or more precisely the metallization 44 deposited at the bottom of the recess, feeds several lasers on either side of the recess via the conductive layer 40. This is represented by arrows 46 out of metallized areas 44. The current then passes vertically through layers 16 since the collector metallized areas 45 are deposited on the top of the stack of layers 16.

To ensure electrical continuity between metallized area 42 on the surface layers 16 and the metallized area 44 at the bottom of recess 48, it is necessary to metallize a vertical wall 49 of the recess. In a similar way, between a metallized area 45 on a row 30 and a metallized area 43 on free surface 31 there is a vertical metallized area 50 on the flank of the row. If they were not insulated, these two metallized areas 49 and 50 would short-circuit semiconductor layers 16. Consequently, an insulating layer 51, for example, alumina $Al_2O_3$, is deposited at least on the internal flanks of recesses 48 and on the flanks of rows 30, under the metallized areas 49 and 50.

In addition, the alumina layer 51 deposited on the recess sides parallel to the laser ribbons 18 prevent lateral diffusion of the light.

To produce an integrated circuit according to the invention requires only slight modifications compared to the process described in patent No. 88 14799 mentioned above. After etching substrate 27 to produce the reflective strips 28 and growing the epitaxial layers 16, recesses 48 are etched before the emitter ribbons 18 are produced.

The metallized areas, for example 45, on the surface of laser rows 30 are deposited first: they are a p+ material, for example Au-Pt, Au-Cr or Au-Pt-Ti. Recesses 48 are then machined, by ionic etching down to conductive layer 40 which, preferably, is in GaAs. A dielectric layer 51, for example, alumina, is then deposited on the vertical sides of recesses 48 to insulate semiconductive layers 16 from the future vertical metallized areas 49. Obviously, following deposit of the dielectric, it is necessary to etch away the layer which will also have been deposited on row 30 and in the bottom of recesses 48, over conductive layer 40.

Metallized areas of type n material, for example 44 and 49, are then deposited on the cleaned layer 40; these metallized areas are again produced by etching away unwanted areas of the metal film, which deposits on all surfaces. Type n metallized films consist of Au-Ge or Au-Ge-Ni and Mo and Au.

The manufacturing process then becomes as described in the patent mentioned earlier; it continues with the implantation of emitter ribbons 18, etching the row structure to allow the laser faces to be cut and the deposit of the distribution metal films 42 and 43.

This entire description is based on one row of lasers 30: if the integrated circuit includes several rows, they may be connected either in series or in parallel.

What is claimed is:

1. An electrical distribution system for a semiconductor laser integrated circuit comprising:

at least one row of lasers for emitting light beams, and comprising a plurality of laser emitter ribbons having center lines;

two reflector strips formed perpendicular to the center lines of the laser emitter ribbons, wherein the at least one row of lasers is located between the two reflector strips;

a first conductive bus formed on a first of the two reflector strips, the first conductive bus having comb teeth interleaved with the laser emitter ribbons and terminating in a first metallized area parallel to the center lines of the laser emitter ribbons; and a second conductive bus formed on a second of the two reflector strips and connected to the at least one row of lasers.

2. An electrical distribution system according to claim 1, wherein the at least one row of lasers comprises a stack of semiconductor layers formed above an epitaxial conductive doped layer, and wherein the first metallized area where the comb teeth of the first conductive bus terminate is connected to the epitaxial conductive doped layer through at least one recess etched through the stack of semiconductor layers.

3. An electrical distribution system according to claim 1, wherein the second conductive bus has comb teeth which terminate in a second metallized area lying on a top face of the at least one row of lasers.

4. An electrical distribution system according to claim 2, further comprising a layer of dielectric material which is applied to vertical flanks of each recess.

5. An electrical distribution system according to claim 1, wherein the vertical layers of dielectric material are metallized.

6. An electrical distribution system for a semiconductor laser integrated circuit comprising:
   at least one row of lasers for emitting light beams and comprising a plurality of laser emitter ribbons having center lines;
   two reflector strips formed perpendicular to the center lines of the laser emitter ribbons, wherein the at least one row of lasers is located between the two reflector strips;
   a first conductive bus formed on a first of the two reflector strips, the first conductive bus having comb teeth interleaved with the laser emitter ribbons and terminating in a first metallized area parallel to the center lines of the laser emitter ribbons;
   a second conductive bus formed on a second of the two reflector strips and connected to the at least one row of lasers;
   wherein the at least one row of lasers comprises a stack of semiconductor layers formed above an epitaxial conductive doped layer, and wherein the first metallized area where the comb teeth of the first conductive bus terminate is connected to the epitaxial conductive doped layer through at least one recess etched through the stack of semiconductor layers, and thereby current flows vertically through the at least one row of lasers from the first conductive bus to the epitaxial conductive doped layer, through the stack of semiconductor layers and to the second conductive bus.

7. An electrical distribution system according to claim 6, wherein the second conductive bus has comb teeth which terminate in a second metallized area lying on a top face of the at least one row of lasers.

8. An electrical distribution system according to claim 7, further comprising a layer of dielectric material which is applied to vertical flanks of each recess.

9. An electrical distribution system according to claim 8, wherein the vertical layers of dielectrical material are metallized.

* * * * *